US012590530B2

(12) United States Patent
Merriott et al.

(10) Patent No.: US 12,590,530 B2
(45) Date of Patent: Mar. 31, 2026

(54) REGENERATIVE DYNAMOMETER FOR USE WITH AN ELECTRICAL SUBMERSIBLE PUMP

(71) Applicant: Baker Hughes Oilfield Operations LLC, Houston, TX (US)

(72) Inventors: Daniel Wayne Merriott, Broken Arrow, OK (US); Charles Collins, Oklahoma City, OK (US); Nicholas Phelps, Broken Arrow, OK (US); Christopher Brunner, Owasso, OK (US); Taoridi Ademoye, Tulsa, OK (US)

(73) Assignee: Baker Hughes Oilfield Operations LLC, Houston, TX (US)

( * ) Notice: Subject to any disclaimer, the term of this patent is extended or adjusted under 35 U.S.C. 154(b) by 280 days.

(21) Appl. No.: 18/521,015

(22) Filed: Nov. 28, 2023

(65) Prior Publication Data

US 2025/0172063 A1     May 29, 2025

(51) Int. Cl.
E21B 47/008 (2012.01)
E21B 43/12 (2006.01)
G01R 31/34 (2020.01)

(52) U.S. Cl.
CPC .......... E21B 47/008 (2020.05); E21B 43/128 (2013.01); G01R 31/343 (2013.01)

(58) Field of Classification Search
CPC .... E21B 47/008; E21B 43/128; G01R 31/343
See application file for complete search history.

(56) References Cited

U.S. PATENT DOCUMENTS

| | | | |
|---|---|---|---|
| 8,347,953 B1 | 1/2013 | Elizondo, Jr. et al. | |
| 2005/0034871 A1* | 2/2005 | Scarsdale .............. | E21B 43/128 |
| | | | 166/105 |
| 2013/0272898 A1 | 10/2013 | Toh et al. | |
| 2018/0223830 A1 | 8/2018 | Maciver et al. | |
| 2021/0207596 A1 | 7/2021 | Semple et al. | |
| 2022/0049695 A1 | 2/2022 | Romer et al. | |

OTHER PUBLICATIONS

International Search Report and Written Opinion for International Application No. PCT/US2024/057695, Report mail date Mar. 18, 2025; pp. 1-12.

* cited by examiner

*Primary Examiner* — Laura Martin
*Assistant Examiner* — Anthony W Megna Fuentes
(74) *Attorney, Agent, or Firm* — Bracewell LLP; Keith R. Derrington

(57) ABSTRACT

A dynamometer is used to dynamically evaluate an electrical submersible pump ("ESP") motor while both are inside of a well. The dynamometer includes a ESP dyno that is mechanically coupled to the ESP motor. The ESP motor and ESP dyno can be a permanent magnet motor or an induction motor, and can have the same or similar values of inertia. Energy absorbed by the ESP dyno can be regenerated as electricity that is transmitted back to a power source, or converted to heat energy in a resistive load bank.

17 Claims, 5 Drawing Sheets

REGENERATIVE DYNAMOMETER FOR USE WITH AN ELECTRICAL SUBMERSIBLE PUMP

BACKGROUND OF THE INVENTION

1. Field of Invention

The present disclosure relates to a dynamometer for testing an electrical submersible pump.

2. Description of Prior Art

Electrical submersible pumps ("ESP") are commonly used in hydrocarbon producing wells. Typically, ESP systems include an electrical motor, a pump having impellers and diffusers, and a driveshaft connected between the motor and pump. The driveshaft is attached to the impellers, and the shaft and impellers rotate when the motor is energized. Rotating impellers draws fluid from inside the well into the pump and forces the fluid through the diffusers, which pressurizes the fluid for delivery to surface.

ESP motors are sometimes tested and/or qualified using a dynamometer, to measure motor outputs, such as, force, moment, and power. Usually, the testing involves attaching a dynamometer to an output shaft of the motor to measure the motor output, which often includes varying a load applied by the dynamometer, and the corresponding output of the motor in response to the changing loads. Drawbacks of testing ESP motors using currently known dynamometers include their expense and infeasibility of conducting testing within a well.

SUMMARY OF THE INVENTION

Disclosed herein is an example method of evaluating an electrical submersible pump ("ESP") motor, which includes forming a test assembly by coupling an output of the ESP motor with an ESP dyno, deploying the test assembly into a well, energizing the ESP motor, monitoring the test assembly, and qualifying the ESP motor for use in lifting liquids from a wellbore based on the step of monitoring. In an example, the ESP motor and ESP dyno can be a permanent magnet motor or an induction motor. The inertia of the ESP dyno is optionally approximately the same as an inertia of the ESP motor. In an alternative, the method further includes monitoring an output from the ESP dyno, and optionally, energizing the ESP motor causes rotation of a shaft in the ESP dyno, and the output from the ESP dyno is electricity that is generated by rotation of the shaft, the method further including connecting the output of the ESP dyno to a resistive load bank and varying a magnitude of resistance in the resistive load bank. In one embodiment, monitoring the test assembly involves monitoring operating information, such as an amount of electricity flowing to the ESP motor, an amount of electricity flowing from the ESP dyno, a torque exerted by the ESP motor, and combinations, and optionally the torque is monitored with a torque cell coupled between the ESP motor and ESP dyno. The ESP dyno can be downhole of the ESP motor. The method in one example further includes regenerating energy delivered to the ESP motor by capturing output from the ESP dyno.

Also disclosed herein is an example of a system for evaluating an electrical submersible pump ("ESP") motor, and that includes an ESP dyno selectively disposed in a test well and having a shaft that is rotationally coupled to a shaft of the ESP motor, a power source in electrical communication with the ESP motor, and a sensor attached to an output of the ESP dyno. The system further optionally includes a hanger selectively coupled between an uphole end of the ESP and a structure mounted over an opening of the test well. The system alternatively also includes a coupling attached between a downhole end of the ESP motor and an uphole end of the ESP dyno, and optionally the coupling is a torque cell that is responsive to a torque exerted between the ESP motor and ESP dyno when the ESP motor is energized. In examples, the sensor is sensitive to an amount of electricity flowing to the ESP motor, an amount of electricity flowing from the ESP dyno, a torque exerted by the ESP motor, and combinations thereof. In an embodiment, an output of the ESP dyno is regenerated to the power source. A resistive load bank can be in electrical communication with an output of the ESP dyno, and in which a resistance through the resistive load bank is variable. The ESP motor and ESP dyno can be a permanent magnet motor or an induction motor.

BRIEF DESCRIPTION OF DRAWINGS

Some of the features and benefits of the present invention having been stated, others will become apparent as the description proceeds when taken in conjunction with the accompanying drawings, in which.

Figure 1:
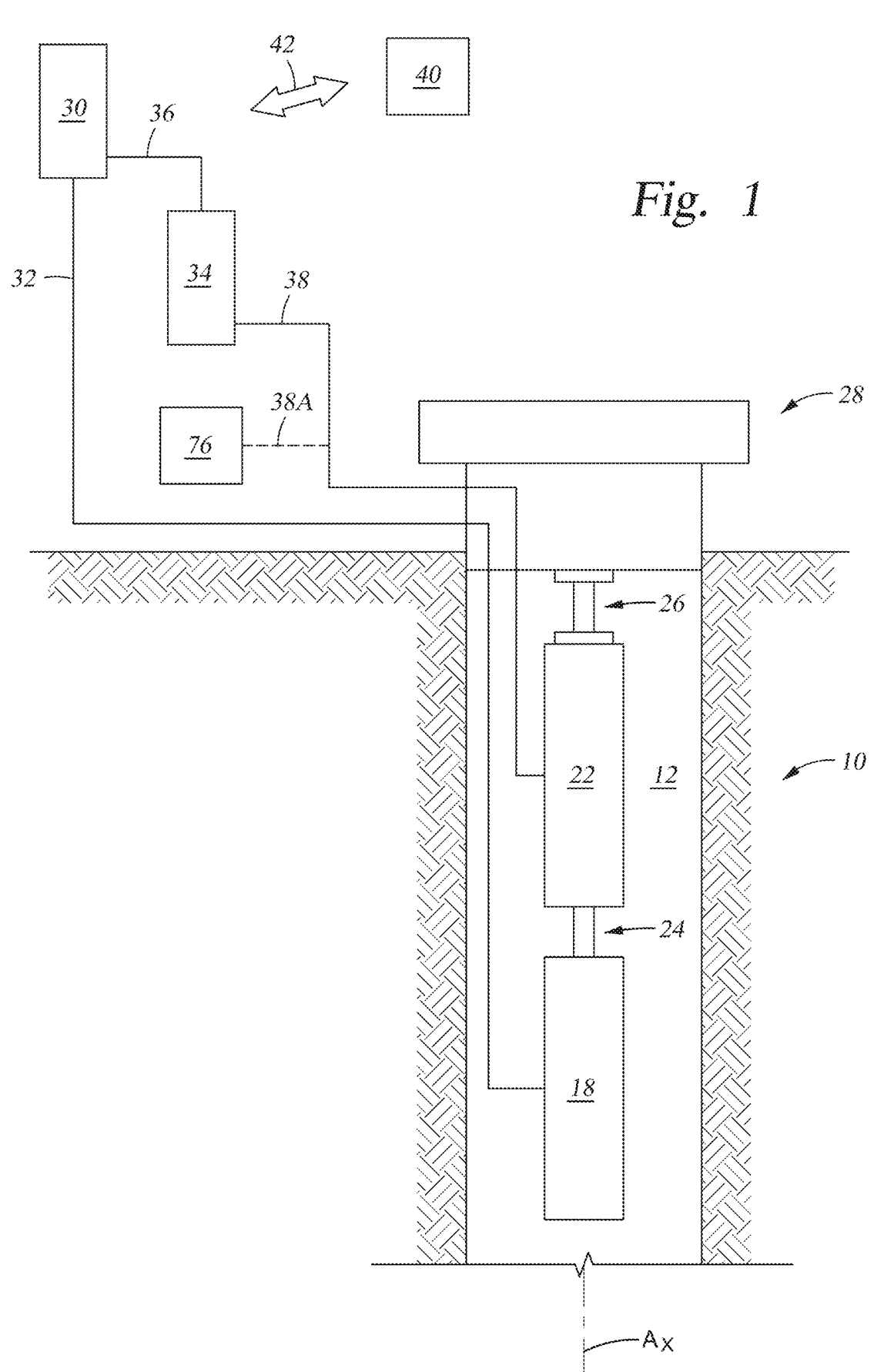
FIG. 1 is a side partial sectional view of an example of evaluating an ESP motor with a dynamometer in a test well.

While subject matter is described in connection with embodiments disclosed herein, it will be understood that the scope of the present disclosure is not limited to any particular embodiment. On the contrary, it is intended to cover all alternatives, modifications, and equivalents thereof.

DETAILED DESCRIPTION OF INVENTION

The method and system of the present disclosure will now be described more fully hereinafter with reference to the accompanying drawings in which embodiments are shown. The method and system of the present disclosure may be in many different forms and should not be construed as limited to the illustrated embodiments set forth herein; rather, these embodiments are provided so that this disclosure will be thorough and complete, and will fully convey its scope to those skilled in the art. Like numbers refer to like elements throughout. In an embodiment, usage of the term "about" includes +/−5% of a cited magnitude. In an embodiment, the term "substantially" includes +/−5% of a cited magnitude, comparison, or description. In an embodiment, usage of the term "generally" includes +/−10% of a cited magnitude.

It is to be further understood that the scope of the present disclosure is not limited to the exact details of construction, operation, exact materials, or embodiments shown and described, as modifications and equivalents will be apparent to one skilled in the art. In the drawings and specification, there have been disclosed illustrative embodiments and, although specific terms are employed, they are used in a generic and descriptive sense only and not for the purpose of limitation.

Shown in a partial side section view in FIG. 1 is an example of a test assembly 10 inserted into a vertical portion of a well 12. The test assembly 10 is for testing an electrical submersible pump ("ESP") motor 18, which as described in more detail below, is to be put in service in a producing well and for lifting liquids from within the well to surface. A dynamometer 22, alternatively referred to herein as an ESP dyno, is included with the test assembly 10 and shown mechanically coupled to an uphole side of the ESP motor 18 by a coupling 24. A hanger 26 supports the test assembly 10 within the well 12 and has an upper end connected to a wellhead 28 which is mounted over an opening of well 12. ESP motor 18 is shown receiving a supply of electricity from a variable speed drive ("VSD") 30 via cable 32, VSD 30 is shown outside of the well 12. A power source 34, also outside of the well 12 on surface, provides electrical power to the VSD 30 through line 36. Examples of the power source 34 include utility lines, power plants, substations, and the like. A line 38 is included which provides electrical communication between the dynamometer 22 and the power source 34. A controller 40 is optionally shown on surface outside of well 12 that is in communication with VSD 30 by communication means 42. Examples of communication means 42 include wireless, acoustic, fiberoptics, and conductive elements.

Figure 2:
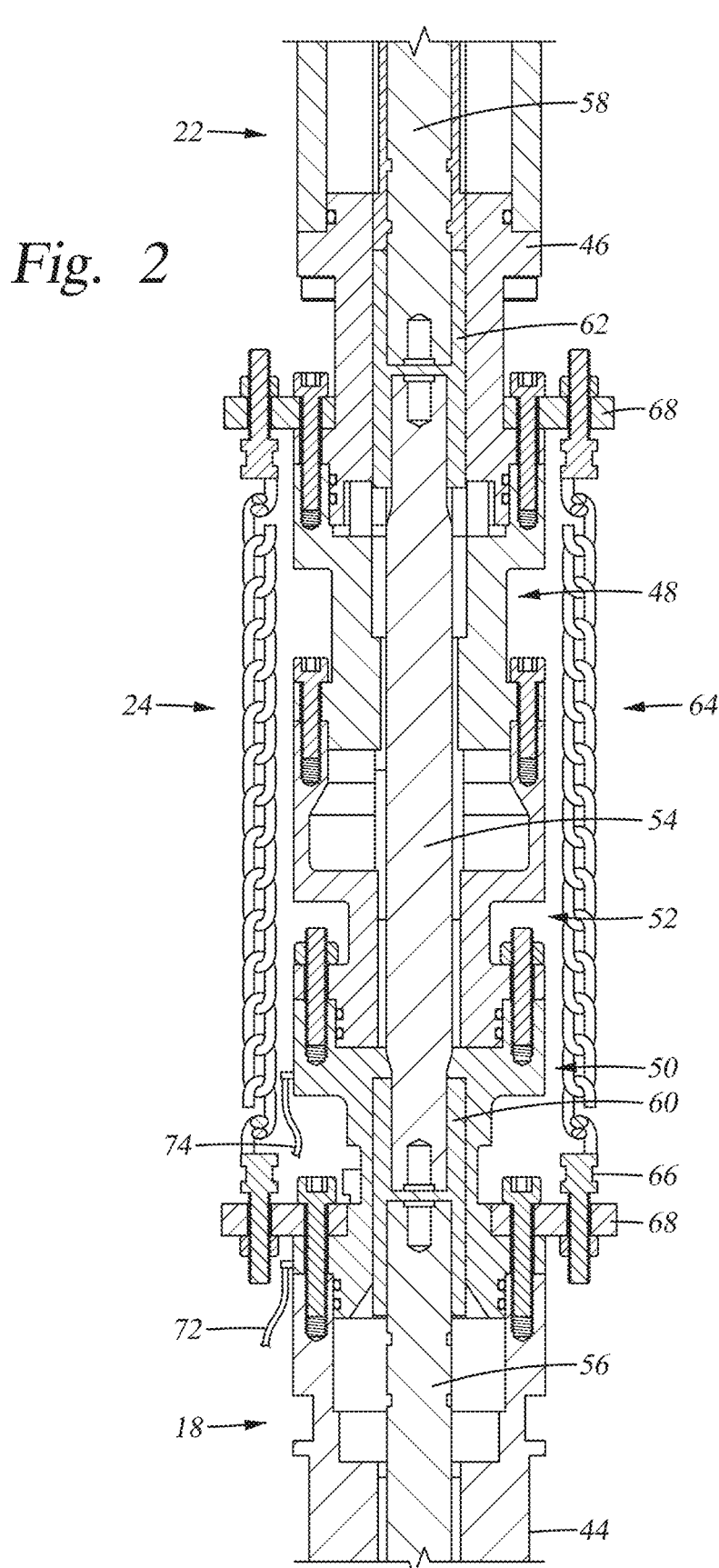
FIG. 2 is a side sectional view of an example of a coupling between the dynamometer and motor of FIG. 1.

An example of the coupling 24 is shown in a side sectional view in FIG. 2. In the example shown, on an uphole end of the ESP motor 18 is an ESP motor head 44, which has an end (not shown) attached to a housing of the ESP motor 18. An end of the dynamometer 22 adjacent coupling 24 is shown having an annular base 46 which attaches to housing of dynamometer 22. A dynamometer head 48 attaches to an end of head 46 opposite dynamometer 22. A torque cell 50 shown mounted to a downhole end of the head 44 and has an opposite end connected to a housing 52. An end of housing 52 opposite from torque cell 50 is shown fastened to an uphole end of the head 48. These elements making up the coupling 24, i.e., the ESP motor head 44, dynamometer base 45, dynamometer head, torque cell 50, and housing 52 are depicted as annular members with axial passages to allow for a coupling shaft 54. As shown, a lower end of coupling shaft 54 engages an upper end of shaft 56 of the ESP motor 18, and an upper end of coupling shaft 54 engages a lower end of shaft 58 disposed within dynamometer 22. Shaft couplings 60, 62 engage upper and lower ends of the shafts 56, 58 to respective lower and upper ends of shaft 54. A chain 64 is optionally included for redundant coupling of the ESP motor 18 and dynamometer 22. Opposing ends of chain 64 are attached to collars 68 shown mounted on upper and lower ends of the ESP motor 18 and dynamometer 22.

Referring back to FIG. 1, well 12 is referred to herein as a test well, which has a depth adequate to receive the entire length of test assembly 10 within and in a substantially vertical orientation. Embodiments of the ESP motor 18 include a permanent magnet motor and an induction motor. Similarly, examples of dynamometer 22 include a permanent magnet motor or an induction motor. An example of a permanent magnet motor is found in Perisho, et al., U.S. Pat. No. 11,608,721, which is incorporated in its entirety herein for all purposes. In further alternatives, the ESP motor 18 and dynamometer 22 are both permanent magnet motors, both induction-type motors, or one being a permanent magnet motor and the other an induction motor. Optional embodiments exist in which ESP motor 18 is uphole of dynamometer 22. In a non-limiting example, rotationally coupling the respective shafts 56, 58 and energizing the ESP motor 18, rotational torque is delivered to shaft 58 of the dynamometer 22; as dynamometer 22 is a motor, rotating shaft 58 generates electrical energy that is transmitted to the power source 34 via line 38. Referring back to FIG. 2, signal leads 72, 74 are shown affixed to the torque cell 50, which in examples transmit signals representative of torque sensed within the torque cell 50. An embodiment of the torque cell 50 includes devices or substances that are sensitive to mechanical strain, such as but not limited to, strain gages, piezo electric devices, electroactive polymers, and other currently known or later strain sensing elements, which produce signals representative of the sensed strain that are transmitted by one of leads 72, 74. In one example, the signals are transmitted to controller 40.

Examples of evaluating the ESP motor 18 include activating the VSD 30 to direct a flow of electricity from line to ESP motor 18, which delivers electricity to and energizes the ESP motor 18. Energizing ESP motor 18 causes shaft 56 to rotate, and adjusting characteristics of the electricity, such as frequency, voltage, phase, and current with the VSD 30, controls rotation of shaft 56 to be at a designated revolutions per minute ("RPM") and/or a designated torque. Examples of evaluating the ESP motor 18 include monitoring one or more of, electricity flowing to motor 18 through line 32, electricity flowing from dynamometer 22 through line 38, and a value of the torque sensed within the torque cell 50. Monitoring the flow of electricity includes monitoring characteristics such as volts, amps, frequency, and phase. Values of the torque within the torque cell 50 are optionally sensed via signal leads 72, 74. In alternatives, the RPM is increased to different levels of RPM and these values of electricity and torque are remeasured. Optional levels of RPM include 1800, 2400, 3000, and 3600. In examples, values of the RPM, electricity, and torque are monitored continuously during the entirety of the evaluation.

In another embodiment of testing, the output of dynamometer 22 is redirected to a resistive load bank 76 that is schematically illustrated on surface. An example of a load bank 76 is available from Resistive load bank, Avtron Power Solutions, 6255 Halle Drive, Cleveland, Ohio 44125, United States. In this embodiment, the line 38 is in electrical communication with the resistive load bank 76 through line 38A. In this example, electricity is supplied to the ESP motor 18 from VSD 30 so that shaft 56 rotates at a designated RPM and/or torque, at the same time different levels of resistance within the load bank 76 are varied, which in turn varies the values of electricity and torque being monitored. In a further alternative of this example, electricity being supplied to the ESP motor 18 from VSD 30 is adjusted so that shaft 56 rotates at a different designated RPM and/or torque, and the step of varying the different levels of resistance within the load bank 76 is repeated. Other parameters are monitored and recorded, such as after a steady state has been reached at each of these resistive loads of electrical output from the dynamometer 22 and values of torque from the torque cell 50. Also recorded is a value of the time corresponding with these values. In another alternative, and with the line 38 connected between the dynamometer 22 and the power source 34, the RPM of the ESP motor is gradually increased a step-wise fashion to, such as increase from about 1800 RPM to about 3600 RPM, and the output values of electricity and torque are measured at each of these values.

Based on the values of electricity and torque measured when undergoing testing of the ESP motor 18, and qualifying the ESP motor 18, i.e., evaluating the suitability of the ESP motor 18 for the service of lifting liquid from within a particular wellbore to surface, in which the wellbore produces liquid. The information obtained by testing or evaluation of ESP motor 18 includes power factor, efficiency of motor, its durability, and other information to assess qualifications for deployment in a liquid-producing wellbore. In an alternative, characteristics of the dynamometer 22 vary with the particular type and characteristics of the ESP motor 18. In one example, a dynamometer 22 selected for evaluation of an ESP motor 18 is selected based on its rotational inertia matching or being close to that of the ESP motor 18. It is within the capabilities of one skilled to match an ESP motor with a dynamometer that also includes a motor, based on their respective rotational inertias.

Figure 3:
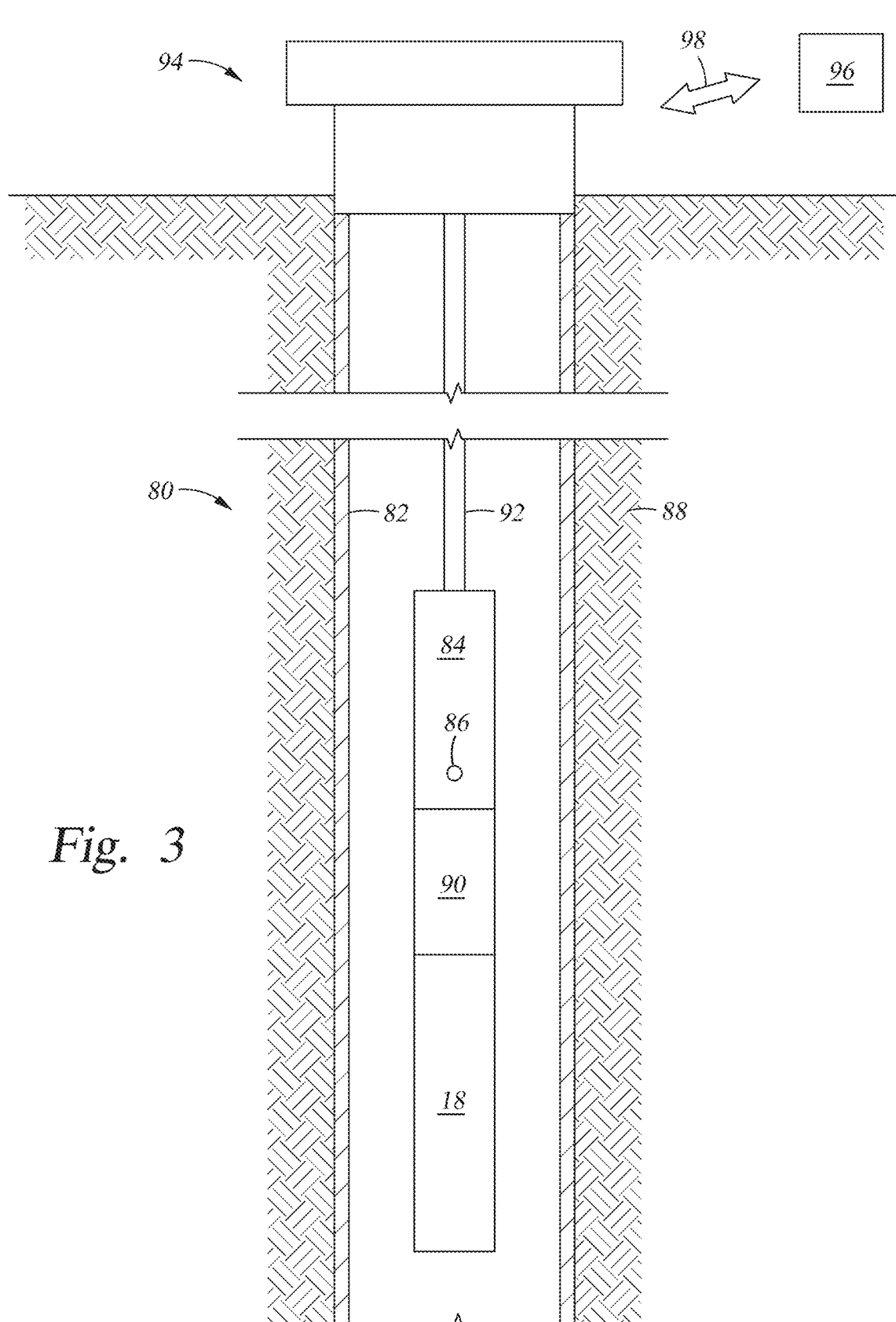
FIG. 3 is a side partial sectional view of an example of a tested ESP motor included with an ESP system submerged in a wellbore.

Referring now to FIG. 3, shown is an example of an ESP assembly 80 disposed in a wellbore 82 and where the assembly 80 includes a pump 84 having an inlet 86 for receiving liquid produced from a formation 88 that surrounds the wellbore 82. In this example, the ESP motor 18 is found to be qualified to operate in wellbore 82 based upon the testing and evaluation conducted using the dynamometer 22 (FIG. 1). In the example of FIG. 3, a seal 92 is disposed in the assembly 80 between the ESP motor 18 and pump 84. Production tubing 92 is shown mounted on an uphole end of pump 84 and for providing a conduit for delivering liquid pressurized by pump 84 to a wellhead assembly 94 shown on surface. Further in this example, a controller 96 is shown outside of wellbore 82 and which is in optional communication with the ESP assembly 80 via communication means 98.

Figure 4A:
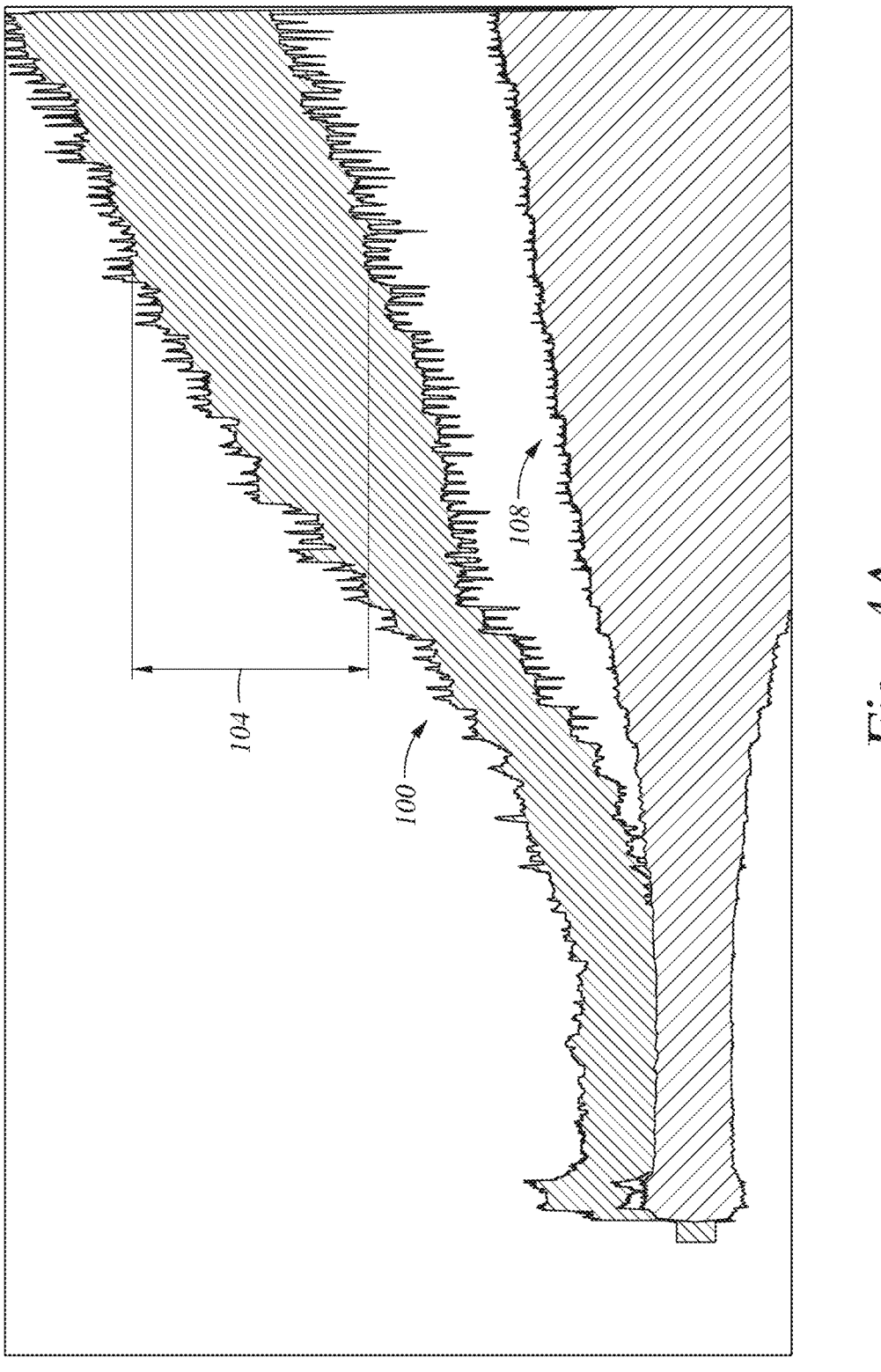
FIGS. 4A and 4B are graphically illustrated data obtained from examples of evaluating an ESP motor.
Figure 4B:
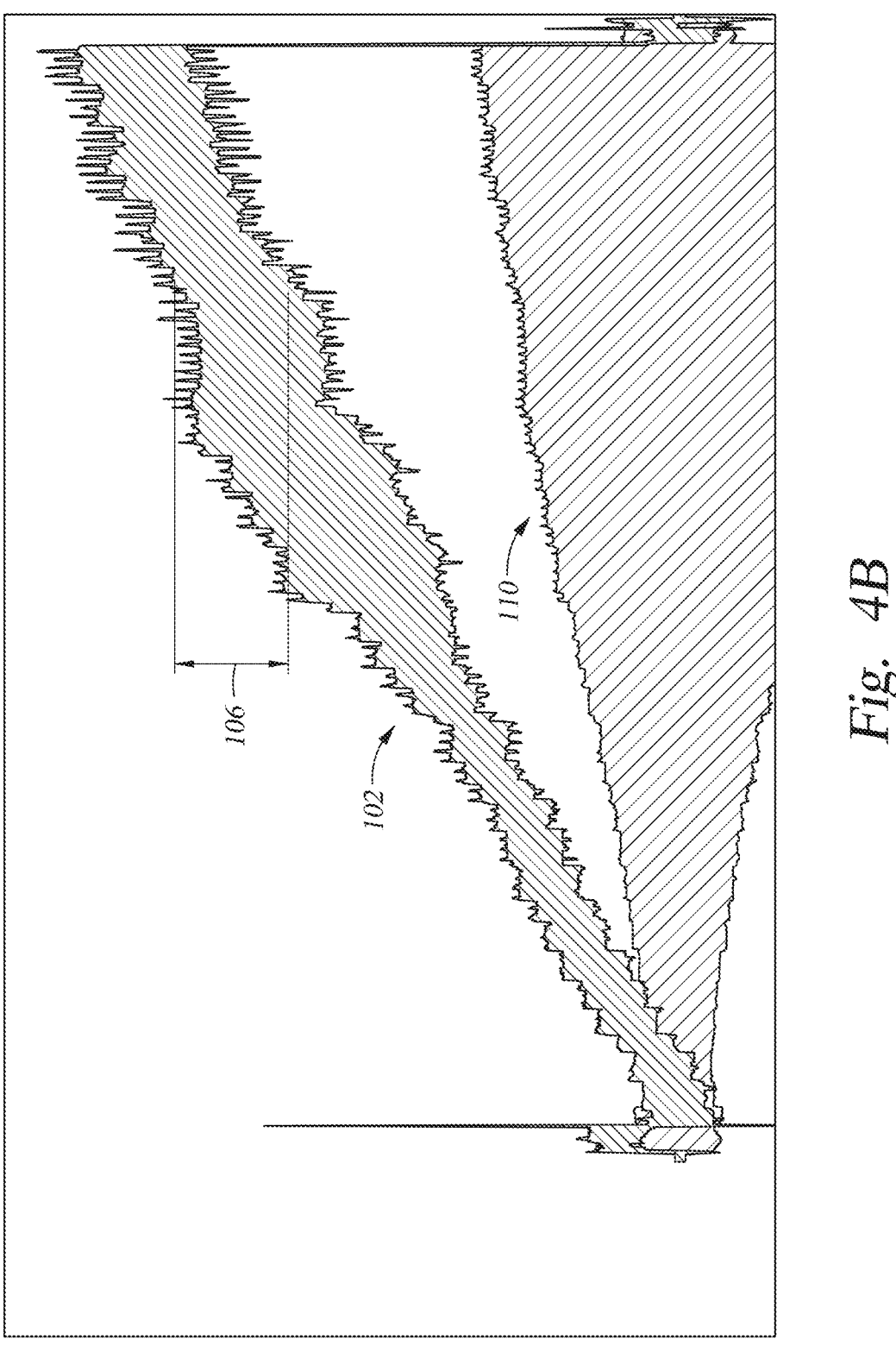

Graphically illustrated in FIG. 4A is an example of data obtained using a prior art dynamometer (referred to as a water brake), and graphically illustrated in FIG. 4B is an example of data obtained using an ESP dyno as depicted in FIG. 1, Plots 100, 102 are shown in FIGS. 4A, 4B, which represent values of torque (ordinate) measured over time (abscissa), where the torque is that generated by the ESP motor 18 and measured in the torque cell 50 (FIG. 2). The values of torque represented by plots 100, 102 have a range of values over discrete time periods and which are represented by bands 104, 106; which are optionally referred to as torque ripple. An advantage of a test assembly using an ESP dyno is shown in FIGS. 4A and 4B, and illustrated by the reduced torque ripple evident in the torque results using the ESP dyno. Also in FIGS. 4A and 4B are plots 108, 110, which represent values of current (amps) consumed by the ESP motor 18 during testing.

The present invention described herein, therefore, is well adapted to carry out the objects and attain the ends and advantages mentioned, as well as others inherent therein. While a presently preferred embodiment of the invention has been given for purposes of disclosure, numerous changes exist in the details of procedures for accomplishing the desired results. For example, although a smaller surface footprint is required when the motor 18 of FIG. 1 is tested in the vertical portion of wellbore 12, testing is optionally performed in a horizontal portion (not shown) of the wellbore 12. These and other similar modifications will readily suggest themselves to those skilled in the art, and are intended to be encompassed within the spirit of the present invention disclosed herein and the scope of the appended claims.

What is claimed is:

1. A method of evaluating an electrical submersible pump ("ESP") motor comprising:

forming a test assembly by coupling an output of the ESP motor with another ESP motor that defines an ESP dyno;

deploying the test assembly into a well;

energizing the ESP motor;

monitoring the test assembly; and qualifying the ESP motor for use in lifting liquids from a wellbore based on the step of monitoring.

2. The method of claim 1, wherein the ESP motor and ESP dyno comprise motors selected from the group consisting of a permanent magnet motor and an induction motor.

3. The method of claim 1, wherein an inertia of the ESP dyno is approximately the same as an inertia of the ESP motor.

4. The method of claim 1, further comprising monitoring an output from the ESP dyno.

5. The method of claim 4, wherein energizing the ESP motor causes rotation of a shaft in the ESP dyno, and wherein the output from the ESP dyno comprises electricity that is generated by rotation of the shaft, the method further comprising connecting the output of the ESP dyno to a resistive load bank and varying a magnitude of resistance in the resistive load bank.

6. The method of claim 1, where monitoring the test assembly comprises monitoring operating information selected from the group consisting of an amount of electricity flowing to the ESP motor, an amount of electricity flowing from the ESP dyno, a torque exerted by the ESP motor, and combinations thereof.

7. The method of claim 6, wherein the torque is monitored with a torque cell coupled between the ESP motor and ESP dyno.

8. The method of claim 1, wherein the ESP dyno is downhole of the ESP motor.

9. The method of claim 1, further comprising regenerating energy delivered to the ESP motor by capturing output from the ESP dyno.

10. A system for evaluating an electrical submersible pump ("ESP") motor comprising:

an ESP dyno selectively disposed in a test well and having a shaft that is rotationally coupled to a shaft of the ESP motor, wherein the ESP dyno comprises another ESP motor;

a power source in electrical communication with the ESP motor; and a sensor attached to an output of the ESP dyno.

11. The system of claim 10, further comprising a hanger selectively coupled between an uphole end of the ESP and a structure mounted over an opening of the test well.

12. The system of claim 10, further comprising a coupling selectively attached between a downhole end of the ESP motor and an uphole end of the ESP dyno.

13. The system of claim 12, wherein the coupling comprises a torque cell that is responsive to a torque exerted between the ESP motor and ESP dyno when the ESP motor is energized.

14. The system of claim 10, wherein the sensor is sensitive to an amount of electricity flowing to the ESP motor, an amount of electricity flowing from the ESP dyno, a torque exerted by the ESP motor, and combinations thereof.

15. The system of claim 10, wherein an output of the ESP dyno is regenerated to the power source.

16. The system of claim 10, further comprising a resistive load bank in electrical communication with an output of the ESP dyno, wherein a resistance through the resistive load bank is variable.

17. The system of claim 10, wherein the ESP motor and ESP dyno comprise a motor type selected from the group consisting of a permanent magnet motor and an induction motor.

* * * * *